(12) United States Patent
Ito et al.

(10) Patent No.: US 10,916,635 B2
(45) Date of Patent: Feb. 9, 2021

(54) SEMICONDUCTOR DEVICE

(71) Applicant: KABUSHIKI KAISHA TOSHIBA, Minato-ku (JP)

(72) Inventors: Kazuyuki Ito, Yokohama (JP); Koji Takaki, Higashihiroshima (JP); Hidehiko Yabuhara, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 68 days.

(21) Appl. No.: 16/355,771

(22) Filed: Mar. 17, 2019

(65) Prior Publication Data

US 2019/0348518 A1 Nov. 14, 2019

(30) Foreign Application Priority Data

May 11, 2018 (JP) .................. 2018-092256

(51) Int. Cl.
*H01L 29/49* (2006.01)
*H01L 29/16* (2006.01)
*H01L 29/739* (2006.01)

(52) U.S. Cl.
CPC ...... *H01L 29/4983* (2013.01); *H01L 29/1608* (2013.01); *H01L 29/7395* (2013.01)

(58) Field of Classification Search
CPC ............. H01L 29/4983; H01L 29/1608; H01L 29/7395

See application file for complete search history.

(56) References Cited

U.S. PATENT DOCUMENTS

| 2007/0128814 A1* | 6/2007 | Fukuda | H01L 29/7831 438/297 |
| 2013/0075756 A1* | 3/2013 | Arthur | H01L 29/78 257/77 |
| 2015/0372095 A1* | 12/2015 | Saito | H01L 29/45 257/77 |
| 2019/0123146 A1* | 4/2019 | Uchida | H01L 29/12 |

FOREIGN PATENT DOCUMENTS

JP 2016-046273 4/2016
WO WO 2014-156791 A1 10/2014

* cited by examiner

*Primary Examiner* — Christine A Enad
(74) *Attorney, Agent, or Firm* — Oblon, McClelland, Maier & Neustadt, L.L.P.

(57) ABSTRACT

According to one embodiment, a semiconductor device includes a semiconductor portion, a gate electrode, a source electrode, a first structure body, and a first insulating portion. The semiconductor portion includes SiC and includes first to third semiconductor regions. The first semiconductor region includes first to third partial regions. The second partial region is provided between the third partial region and the first partial region. The third semiconductor region is provided between the second partial region and the second semiconductor region. The source electrode is electrically connected to the second semiconductor region. The first insulating portion includes a first insulating region and a second insulating region. The first insulating region is provided between the first partial region and the gate electrode. The second insulating region is provided between the second semiconductor region and the first structure body. The first structure body includes at least one of polysilicon or TiN.

10 Claims, 4 Drawing Sheets

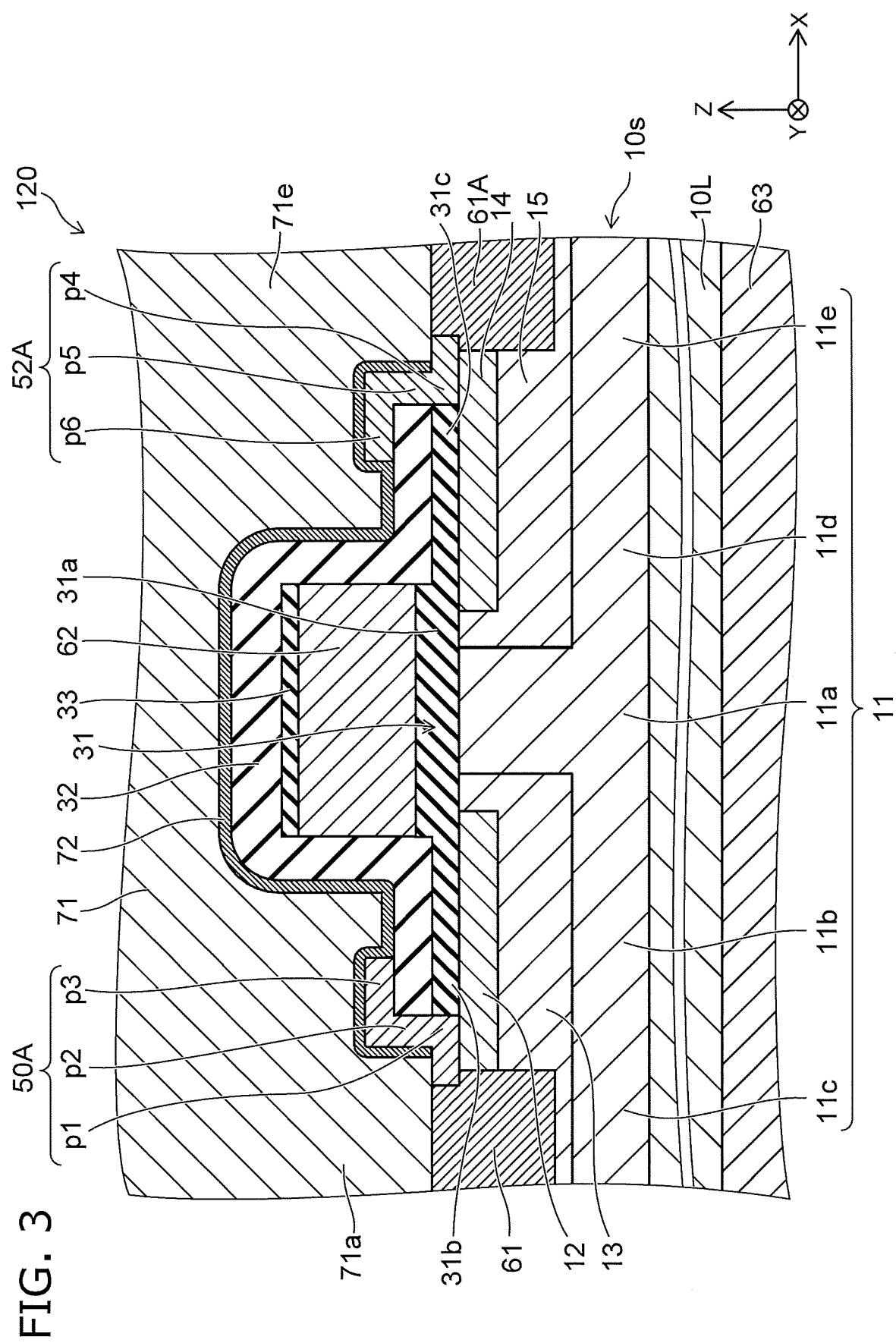

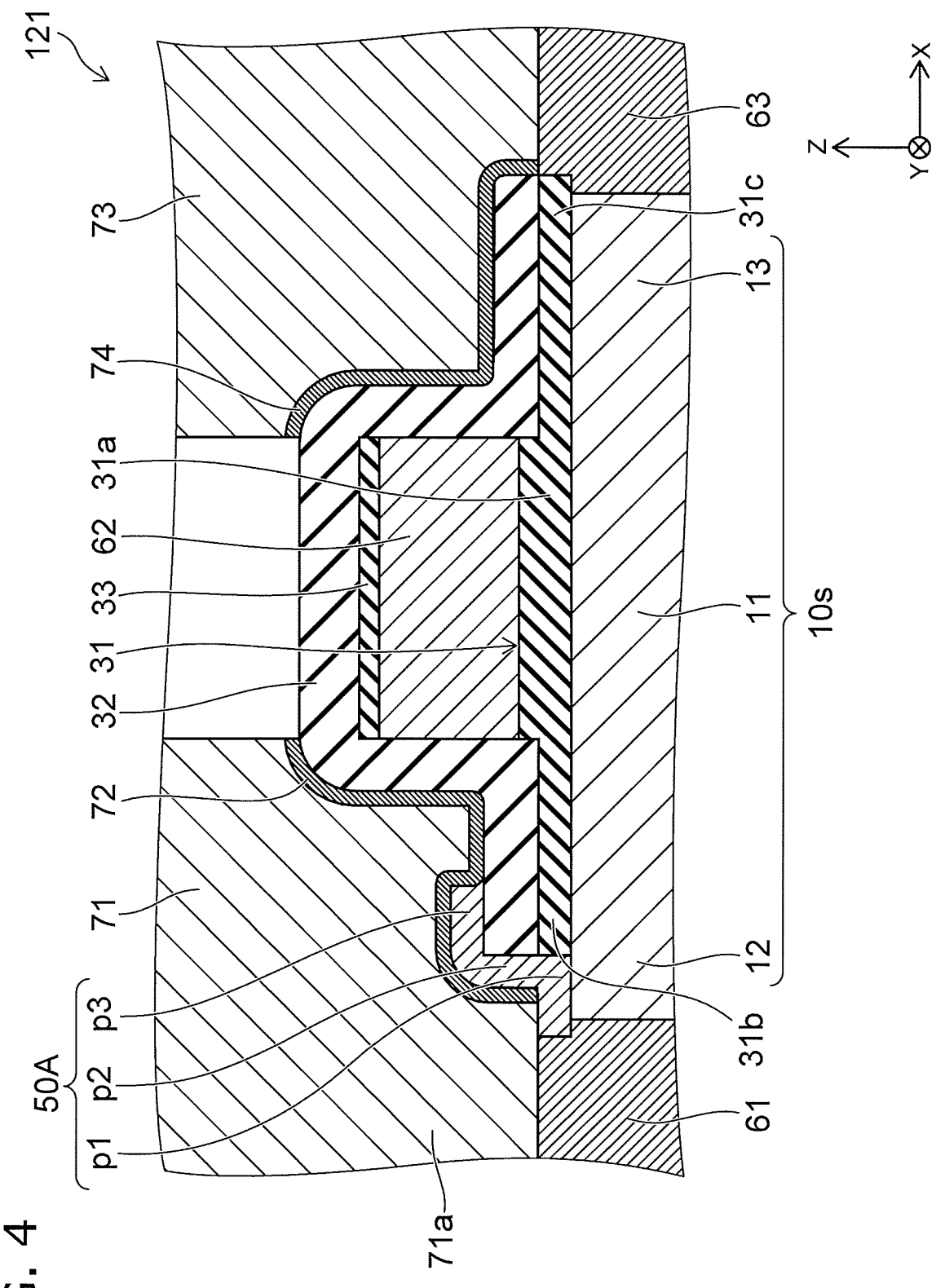

SEMICONDUCTOR DEVICE

CROSS-REFERENCE TO RELATED APPLICATIONS

This application is based upon and claims the benefit of priority from Japanese Patent Application No. 2018-092256, filed on May 11, 2018; the entire contents of which are incorporated herein by reference.

FIELD

Embodiments described herein relate generally to a semiconductor device.

BACKGROUND

It is desirable to improve the characteristics of a semiconductor device.

BRIEF DESCRIPTION OF THE DRAWINGS

FIG. 3 is a schematic cross-sectional view illustrating a semiconductor device according to a second embodiment; and FIG. 4 is a schematic cross-sectional view illustrating a semiconductor device according to a modification of the second embodiment.

DETAILED DESCRIPTION

Figure 1:
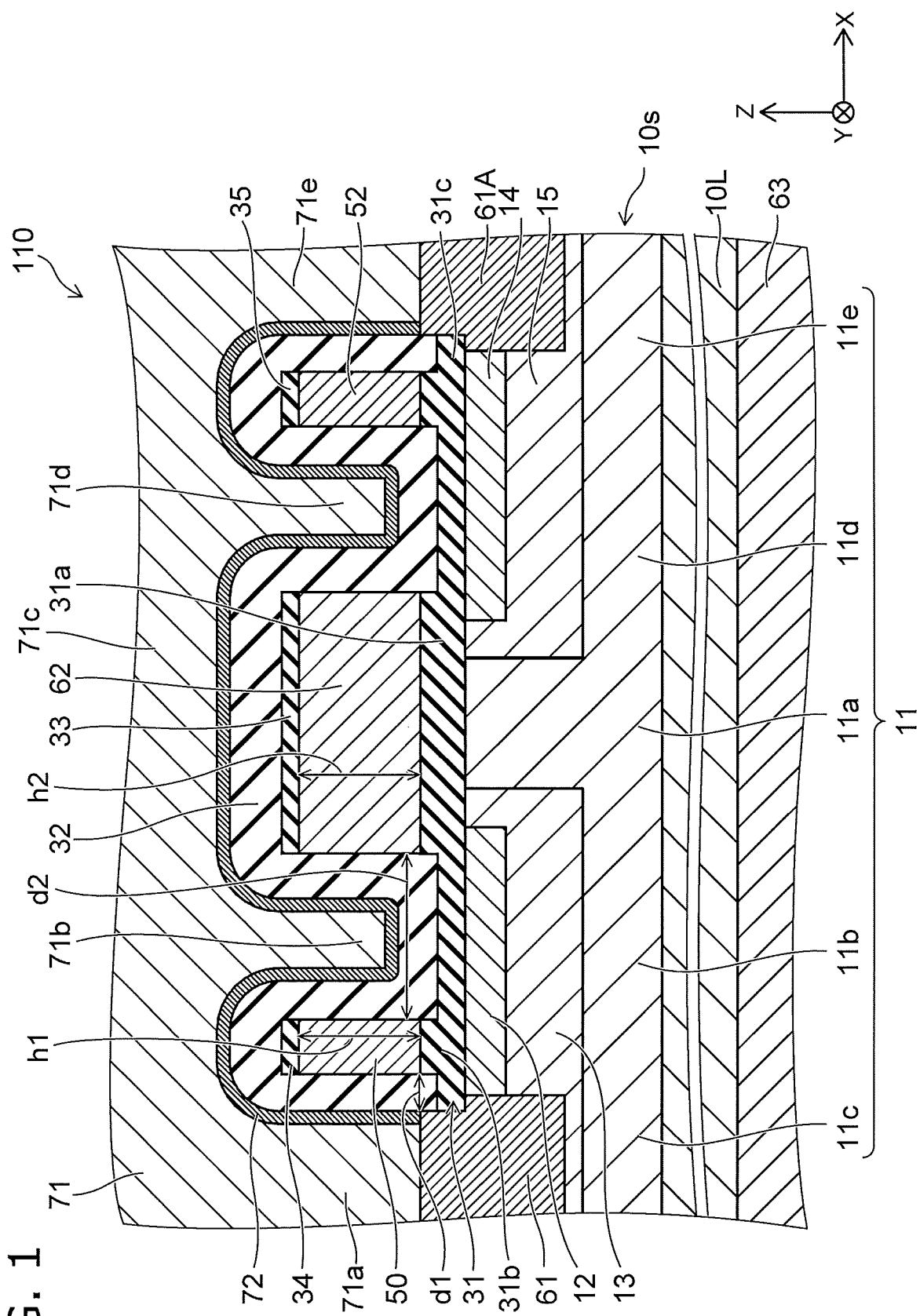
FIG. 1 is a schematic cross-sectional view illustrating a semiconductor device according to a first embodiment.

According to one embodiment, a semiconductor device includes a semiconductor portion, a gate electrode, a source electrode, a first structure body, and a first insulating portion. The semiconductor portion includes SiC and includes first to third semiconductor regions. The first semiconductor region is of a first conductivity type and includes first to third partial regions. The second semiconductor region is of the first conductivity type. A first direction from the second partial region toward the second semiconductor region crosses a second direction from the second partial region toward the first partial region. The second partial region is provided between the third partial region and the first partial region in the second direction. The third semiconductor region is of a second conductivity type and is provided between the second partial region and the second semiconductor region in the first direction. A direction from the first partial region toward the gate electrode is aligned with the first direction. The source electrode is electrically connected to the second semiconductor region. A direction from the third partial region toward the source electrode is aligned with the first direction. A position in the second direction of the first structure body is between a position in the second direction of the source electrode and a position in the second direction of the gate electrode. The first insulating portion includes a first insulating region and a second insulating region. The first insulating region is provided between the first partial region and the gate electrode in the first direction. The second insulating region is provided between the second semiconductor region and the first structure body in the first direction. A direction from the second insulating region toward the first insulating region is aligned with the second direction. The first structure body includes at least one of polysilicon or TiN.

According to another embodiment, a semiconductor device includes a semiconductor portion, a gate electrode, a source electrode, a first insulating portion, and a first structure body. The semiconductor portion includes SiC and includes first to third semiconductor regions. The first semiconductor region is of a first conductivity type and includes first to third partial regions. The second semiconductor region is of the first conductivity type. A first direction from the second partial region toward the second semiconductor region crosses a second direction from the second partial region toward the first partial region. The second partial region is provided between the third partial region and the first partial region in the second direction. The third semiconductor region is of a second conductivity type and is provided between the second partial region and the second semiconductor region in the first direction. A direction from the first partial region toward the gate electrode is aligned with the first direction. A source electrode is electrically connected to the second semiconductor region. A direction from the third partial region toward the source electrode is aligned with the first direction. The first insulating portion includes a first insulating region and a second insulating region. The first insulating region is provided between the first partial region and the gate electrode in the first direction. A direction from the second insulating region toward the first insulating region is aligned with the second direction. The first structure body includes a first portion. The first portion is positioned between the source electrode and the second insulating region. The first portion includes at least one of polysilicon or TiN.

A semiconductor device includes a semiconductor portion, a gate electrode, a source electrode, a first insulating portion, a first conductive portion, a second insulating portion, and a first structure body. The semiconductor portion includes SiC and includes first to third semiconductor regions. The first semiconductor region is of a first conductivity type and includes first to third partial regions. The second semiconductor region is of the first conductivity type. A first direction from the second partial region toward the second semiconductor region crosses a second direction from the second partial region toward the first partial region. The second partial region is provided between the third partial region and the first partial region in the second direction. The third semiconductor region is of a second conductivity type and is provided between the second partial region and the second semiconductor region in the first direction. A direction from the first partial region toward the gate electrode is aligned with the first direction. The source electrode is electrically connected to the second semiconductor region. A direction from the third partial region toward the source electrode is aligned with the first direction. The first insulating portion includes a first insulating region. The first insulating region is provided between the first partial region and the gate electrode in the first direction. The first conductive portion includes a first conductive region and is electrically connected to the source electrode. A direction from the source electrode toward the first conductive region is aligned with the first direction. The second insulating portion is provided between the gate electrode and the first conductive portion and between the first insulating portion and the first conductive portion. The first structure body includes a second portion. The second portion is positioned between the source electrode and the second insulating portion. The second portion includes at least one of polysilicon or TiN.

According to another embodiment, a semiconductor device includes a semiconductor portion, a gate electrode, a source electrode, a first structure body, and a first insulating portion. The semiconductor portion includes SiC and includes a first semiconductor region and a second semiconductor region. A first direction from the first semiconductor region toward the gate electrode crosses a second direction from the second semiconductor region toward the first semiconductor region. The source electrode is electrically connected to the second semiconductor region. A position in the second direction of the first structure body is between a position in the second direction of the source electrode and a position in the second direction of the gate electrode. The first insulating portion includes a first insulating region and a second insulating region. The first insulating region is provided between the first semiconductor region and the gate electrode in the first direction. The second insulating region is provided between the second semiconductor region and the first structure body in the first direction. A direction from the second insulating region toward the first insulating region is aligned with the second direction. The first structure body includes at least one of polysilicon or TiN.

According to another embodiment, a semiconductor device includes a semiconductor portion, a gate electrode, a source electrode, a first insulating portion, and a first structure body. The semiconductor portion includes SiC and includes a first semiconductor region and a second semiconductor region. A first direction from the first semiconductor region toward the gate electrode crosses a second direction from the second semiconductor region toward the first semiconductor region. The source electrode is electrically connected to the second semiconductor region. The first insulating portion includes a first insulating region and a second insulating region. The first insulating region is provided between the first semiconductor region and the gate electrode in the first direction. A direction from the second insulating region toward the first insulating region is aligned with the second direction. The first structure body includes a first portion. The first portion is positioned between the source electrode and the second insulating region. The first portion includes at least one of polysilicon or TiN.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a semiconductor portion 10s, a source electrode 61, a gate electrode 62, a drain electrode 63, a first structure body 50, and a first insulating portion 31. The semiconductor portion 10s includes silicon carbide (SiC).

The semiconductor portion 10s includes first to third semiconductor regions 11 to 13.

The first semiconductor region 11 and the second semiconductor region 12 are of a first conductivity type. The third semiconductor region 13 is of a second conductivity type.

For example, the first conductivity type is an n-type; and the second conductivity type is a p-type. The first conductivity type may be the p-type; and the second conductivity type may be the n-type. In the following example, the first conductivity type is the n-type; and the second conductivity type is the p-type.

An n-type impurity includes, for example, at least one selected from the group consisting of N, P, and As. A p-type impurity includes, for example, at least one selected from the group consisting of B, Al, and Ga.

The first semiconductor region 11 includes first to third partial regions 11a to 11c. A first direction from the second partial region 11b toward the second semiconductor region 12 crosses a second direction from the second partial region 11b toward the first partial region 11a. The second partial region 11b is provided between the third partial region 11c and the first partial region 11a in the second direction.

The first direction is taken as a Z-axis direction. One direction perpendicular to the Z-axis direction is taken as an X-axis direction. A direction perpendicular to the Z-axis direction and the X-axis direction is taken as a Y-axis direction. The second direction crosses the first direction (the Z-axis direction). The second direction is, for example, the X-axis direction.

The direction from the second semiconductor region 12 toward the first partial region 11a is aligned with the second direction (the X-axis direction).

The third semiconductor region 13 is provided between the second partial region 11b and the second semiconductor region 12 in the first direction (the Z-axis direction). The direction from the third semiconductor region 13 toward the first partial region 11a is aligned with the second direction (the X-axis direction). In the example, a portion of the third semiconductor region 13 is positioned between the second semiconductor region 12 and the first partial region 11a in the second direction (the X-axis direction).

The source electrode 61 is electrically connected to the second semiconductor region 12. The source electrode 61 is provided on the third partial region 11c. The direction from the third partial region 11c toward the source electrode 61 is aligned with the first direction (the Z-axis direction). In the example, a portion of the third semiconductor region 13 is positioned between the third partial region 11c and the source electrode 61 in the first direction (the Z-axis direction).

For example, the second semiconductor region 12 is positioned between the source electrode 61 and the first partial region 11a in the second direction (the X-axis direction). For example, the third semiconductor region 13 is positioned between the source electrode 61 and the first partial region 11a in the second direction (the X-axis direction). The source electrode 61 includes, for example, NiSi.

The gate electrode 62 is provided on the first partial region 11a. The direction from the first partial region 11a toward the gate electrode 62 is aligned with the first direction (the Z-axis direction). The gate electrode 62 includes, for example, polysilicon.

The drain electrode 63 is electrically connected to the first semiconductor region 11. The drain electrode 63 is provided under the first semiconductor region 11. In the example, the first partial region 11a is positioned between the drain electrode 63 and the gate electrode 62 in the first direction (the Z-axis direction). The second partial region 11b is positioned between the drain electrode 63 and the third semiconductor region 13 in the first direction (the Z-axis direction). The third partial region 11c is positioned between the drain electrode 63 and the source electrode 61 in the first direction (the Z-axis direction).

The first structure body 50 is provided on the second semiconductor region 12. The direction from the second semiconductor region 12 toward the first structure body 50 is aligned with the first direction (the Z-axis direction). The first structure body 50 includes at least one of polysilicon or TiN.

The position in the second direction (the X-axis direction) of the first structure body 50 is between the position in the second direction (the X-axis direction) of the source electrode 61 and the position in the second direction (the X-axis direction) of the gate electrode 62. For example, the direction from the first structure body 50 toward the gate electrode 62 is aligned with the second direction (the X-axis direction). The gate electrode 62 is separated from the first structure body 50 in the second direction (the X-axis direction).

The first insulating portion 31 includes a first insulating region 31a and a second insulating region 31b. The first insulating region 31a is provided between the first partial region 11a and the gate electrode 62 in the first direction (the Z-axis direction). The second insulating region 31b is provided between the second semiconductor region 12 and the first structure body 50 in the first direction (the Z-axis direction). For example, the first structure body 50 contacts the second insulating region 31b. The direction from the second insulating region 31b toward the first insulating region 31a is aligned with the second direction (the X-axis direction). The first insulating portion 31 includes, for example, silicon oxide.

For example, the first to third partial regions 11a to 11c are provided on the drain electrode 63. The first insulating region 31a is provided on the first partial region 11a. The gate electrode 62 is provided on the first insulating region 31a. The third semiconductor region 13 is provided on the second partial region 11b. The second semiconductor region 12 is provided on the third semiconductor region 13. The second insulating region 31b is provided on the second semiconductor region 12. The first structure body 50 is provided on the second insulating region 31b. The source electrode 61 is provided on the third partial region 11c. In the example, a portion of the source electrode 61 is positioned at the side of the second semiconductor region 12. A portion of the source electrode 61 is positioned at the side of the second insulating region 31b.

As shown in FIG. 1, a first conductive portion 71, a second conductive portion 72, and second to fourth insulating portions 32 to 34 are further provided in the example.

The first conductive portion 71 is electrically connected to the source electrode 61. The first conductive portion 71 includes first to third conductive regions 71a to 71c. The second conductive region 71b is positioned between the first conductive region 71a and the third conductive region 71c in the second direction (the X-axis direction). The direction from the source electrode 61 toward the first conductive region 71a is aligned with the first direction (the Z-axis direction). The direction from the gate electrode 62 toward the third conductive region 71c is aligned with the first direction (the Z-axis direction). For example, a portion of the second conductive region 71b is positioned between the first structure body 50 and the gate electrode 62 in the second direction (the X-axis direction). The first conductive portion 71 includes, for example, a metal such as Al, etc.

The second conductive portion 72 is provided between the second insulating portion 32 and the first conductive portion 71. The second conductive portion 72 includes, for example, a metal such as Ti, etc.

The second insulating portion 32 is provided on the gate electrode 62, on the first structure body 50, and on the first insulating portion 31. A portion of the second insulating portion 32 is provided between the gate electrode 62 and the first conductive portion 71. The portion of the second insulating portion 32 insulates the gate electrode 62 and the first conductive portion 71 from each other. Another portion of the second insulating portion 32 is provided between the first structure body 50 and the first conductive portion 71. The other portion of the second insulating portion 32 insulates the first structure body 50 and the first conductive portion 71 from each other. The second insulating portion 32 includes, for example, silicon oxide.

The first structure body 50 is positioned between the second insulating region 31b and the second insulating portion 32. For example, the second insulating portion 32 covers the first structure body 50 provided on the second insulating region 31b. The gate electrode 62 is positioned between the first insulating region 31a and the second insulating portion 32. For example, the second insulating portion 32 covers the gate electrode 62 provided on the first insulating region 31a.

In the example, one other portion of the second insulating portion 32 is positioned between the first structure body 50 and the gate electrode 62 in the second direction (the X-axis direction). The one other portion of the second insulating portion 32 is positioned between the second conductive region 71b of the first conductive portion 71 and the first insulating portion 31 in the first direction (the Z-axis direction).

The third insulating portion 33 is provided on the gate electrode 62. The direction from the gate electrode 62 toward the third insulating portion 33 is aligned with the first direction (the Z-axis direction). The gate electrode 62 is positioned between the first insulating region 31a and the third insulating portion 33 in the first direction (the Z-axis direction). The third insulating portion 33 includes, for example, silicon oxide.

The fourth insulating portion 34 is provided on the first structure body 50. The direction from the first structure body 50 toward the fourth insulating portion 34 is aligned with the first direction (the Z-axis direction). The first structure body 50 is positioned between the second insulating region 31b and the fourth insulating portion 34 in the first direction (the Z-axis direction). The fourth insulating portion 34 includes, for example, silicon oxide.

The semiconductor device 110 is, for example, a transistor. For example, the first insulating portion 31 functions as a gate insulating film. For example, the second to fourth insulating portions 32 to 34 function as inter-layer insulating films. For example, the first conductive portion 71 functions as an interconnect electrode. For example, the second conductive portion 72 functions as a barrier metal.

For example, the first semiconductor region 11 functions as a drift region. For example, a region that includes the second semiconductor region 12 and the third semiconductor region 13 functions as a channel region. The second semiconductor region 12 functions as a contact region for the source electrode 61.

In the example, the semiconductor device 110 further includes a semiconductor layer 10L. In the first direction (the Z-axis direction), the semiconductor layer 10L is positioned between the drain electrode 63 and the first partial region 11a, between the drain electrode 63 and the second partial region 11b, and between the drain electrode 63 and the third partial region 11c. The semiconductor layer 10L is of the first conductivity type or the second conductivity type. In the case where the semiconductor layer 10L is of the first conductivity type, the semiconductor device 110 functions as a MOS transistor. In the case where the semiconductor layer 10L is of the second conductivity type, the semiconductor device 110 functions as an IGBT (Insulated Gate Bipolar Transistor).

The gate electrode 62 overlaps the second semiconductor region 12 in the first direction (the Z-axis direction). For example, a portion of the first insulating region 31a of the first insulating portion 31 is positioned between the second semiconductor region 12 and the gate electrode 62 in the first direction (the Z-axis direction).

For example, there are cases where the source electrode 61 that includes Ni is used in a SiC power device or the like having a planar structure. When the device is downscaled to reduce the on-resistance, the distance between the source electrode 61 and the gate electrode 62 becomes short. In such a device, Ni that is freed from the source electrode 61 may reach the gate electrode 62 and increase the leakage current between the source electrode 61 and the gate electrode 62.

In the embodiment, the first structure body 50 that includes at least one of polysilicon or TiN is provided between the source electrode 61 and the gate electrode 62; for example, the Ni that is freed from the source electrode 61 and reaches the gate electrode 62 can be suppressed thereby. The increase of the leakage current between the source electrode 61 and the gate electrode 62 can be suppressed thereby. For example, the reliability of the device can be increased.

In the embodiment, for example, the first structure body 50 that includes at least one of polysilicon or TiN absorbs or blocks Ni. For example, in the case where the first structure body 50 includes polysilicon, the Ni that is freed from the source electrode 61 bonds with the polysilicon included in the first structure body 50 and is adsorbed easily by the first structure body 50. For example, in the case where the first structure body 50 includes TiN, the Ni that is freed from the source electrode 61 does not pass through the first structure body 50 easily. The Ni that is freed from the source electrode 61 and reaches the gate electrode 62 can be suppressed thereby.

In the example, for example, a length h1 in the first direction (the Z-axis direction) of the first structure body 50 is substantially the same as a length h2 in the first direction (the Z-axis direction) of the gate electrode 62. The length h1 may be longer than the length h2. The length h1 may be shorter than the length h2. In the case where the length h1 is longer than the length h2, the increase of the leakage current between the source electrode 61 and the gate electrode 62 is suppressed easily.

In the example, a distance d1 in the second direction (the X-axis direction) between the first structure body 50 and the source electrode 61 is shorter than a distance d2 in the second direction (the X-axis direction) between the first structure body 50 and the gate electrode 62. The distance d1 may be substantially the same as the distance d2. The distance d1 may be longer than the distance d2. In the case where the distance d1 is shorter than the distance d2, the increase of the leakage current between the source electrode 61 and the gate electrode 62 is suppressed easily.

As shown in FIG. 1, the semiconductor device 110 may further include a fourth semiconductor region 14, a fifth semiconductor region 15, another source electrode 61A, and a second structure body 52. The first semiconductor region 11 may further include a fourth partial region 11d and a fifth partial region 11e. The first insulating portion 31 may further include a third insulating region 31c.

The fourth partial region 11d is provided between the first partial region 11a and the fifth partial region 11e in the second direction (the X-axis direction). The direction from the fourth partial region 11d toward the fourth semiconductor region 14 is aligned with the first direction (the Z-axis direction).

The fourth semiconductor region 14 is of the first conductivity type. The direction from the first partial region 11a toward the fourth semiconductor region 14 is aligned with the second direction (the X-axis direction). The gate electrode 62 overlaps the fourth semiconductor region 14 in the first direction (the Z-axis direction). For example, a portion of the first insulating region 31a of the first insulating portion 31 is provided between the fourth semiconductor region 14 and the gate electrode 62 in the first direction (the Z-axis direction).

The fifth semiconductor region 15 is of the second conductivity type. The fifth semiconductor region 15 is provided between the fourth partial region 11d and the fourth semiconductor region 14 in the first direction (the Z-axis direction). The direction from the first partial region 11a toward the fifth semiconductor region 15 is aligned with the second direction (the X-axis direction). In the example, a portion of the fifth semiconductor region 15 is positioned between the first partial region 11a and the fourth semiconductor region 14 in the second direction (the X-axis direction).

A region that includes the fourth semiconductor region 14 and the fifth semiconductor region 15 functions as, for example, a channel region. The fourth semiconductor region 14 functions as a contact region for the other source electrode 61A.

The other source electrode 61A is electrically connected to the fourth semiconductor region 14. The other source electrode 61A is provided on the fifth partial region 11e. The direction from the fifth partial region 11e toward the other source electrode 61A is aligned with the first direction (the Z-axis direction). In the example, a portion of the fifth semiconductor region 15 in the first direction (the Z-axis direction) is positioned between the fifth partial region 11e and the other source electrode 61A.

For example, the fourth semiconductor region 14 is positioned between the first partial region 11a and the other source electrode 61A in the second direction (the X-axis direction). For example, the fifth semiconductor region 15 is positioned between the first partial region 11a and the other source electrode 61A in the second direction (the X-axis direction). The other source electrode 61A includes, for example, NiSi.

The second structure body 52 is provided on the fourth semiconductor region 14. The direction from the fourth semiconductor region 14 toward the second structure body 52 is aligned with the first direction (the Z-axis direction). The second structure body 52 includes at least one of polysilicon or TiN. For example, the configuration of the second structure body 52 is the same as the configuration of the first structure body 50.

The position in the second direction (the X-axis direction) of the second structure body 52 is between the position in the second direction (the X-axis direction) of the gate electrode 62 and the position in the second direction (the X-axis direction) of the other source electrode 61A. For example, the direction from the gate electrode 62 toward the second structure body 52 is aligned with the second direction (the X-axis direction). The gate electrode 62 is separated from the second structure body 52 in the second direction (the X-axis direction).

The third insulating region 31c is provided between the fourth semiconductor region 14 and the second structure body 52 in the first direction (the Z-axis direction). For example, the second structure body 52 contacts the third insulating region 31c. The direction from the first insulating region 31a toward the third insulating region 31c is aligned with the second direction (the X-axis direction). The first insulating region 31a is positioned between the second insulating region 31b and the third insulating region 31c in the second direction (the X-axis direction).

For example, the fourth partial region 11d and the fifth partial region 11e are provided on the drain electrode 63. The fifth semiconductor region 15 is provided on the fourth partial region 11d. The fourth semiconductor region 14 is provided on the fifth semiconductor region 15. The third insulating region 31c is provided on the fourth semiconductor region 14. The second structure body 52 is provided on the third insulating region 31c. The other source electrode 61A is provided on the fifth partial region 11e. In the example, a portion of the other source electrode 61A is positioned at the side of the fourth semiconductor region 14. A portion of the other source electrode 61A is positioned at the side of the third insulating region 31c.

A fifth insulating portion 35 may be further provided as shown in FIG. 1. The fifth insulating portion 35 is provided on the second structure body 52. The direction from the second structure body 52 toward the fifth insulating portion 35 is aligned with the first direction (the Z-axis direction). The second structure body 52 is positioned between the third insulating region 31c and the fifth insulating portion 35 in the first direction (the Z-axis direction). The fifth insulating portion 35 includes, for example, silicon oxide. For example, the fifth insulating portion 35 functions as an inter-layer insulating film.

In the example, the first conductive portion 71 is electrically connected to the other source electrode 61A. The first conductive portion 71 further includes a fourth conductive region 71d and a fifth conductive region 71e. The fourth conductive region 71d is positioned between the third conductive region 71c and the fifth conductive region 71e in the second direction (the X-axis direction). The direction from the other source electrode 61A toward the fifth conductive region 71e is aligned with the first direction (the Z-axis direction). For example, the fourth conductive region 71d is positioned between the gate electrode 62 and the second structure body 52 in the second direction (the X-axis direction).

In the example, the second insulating portion 32 is provided between the second structure body 52 and the first conductive portion 71. The second structure body 52 is positioned between the third insulating region 31c and the second insulating portion 32. For example, the second insulating portion 32 covers the second structure body 52 provided on the third insulating region 31c.

In the example, a portion of the second insulating portion 32 is positioned between the gate electrode 62 and the second structure body 52 in the second direction (the X-axis direction). A portion of the second insulating portion 32 is positioned between the first insulating portion 31 and the fourth conductive region 71d of the first conductive portion 71 in the first direction (the Z-axis direction).

The second structure body 52 that includes at least one of polysilicon or TiN is provided between the other source electrode 61A and the gate electrode 62; for example, Ni that is freed from the other source electrode 61A and reaches the gate electrode 62 can be suppressed thereby. The increase of the leakage current between the other source electrode 61A and the gate electrode 62 can be suppressed thereby. For example, the reliability of the device can be increased.

Figure 2:
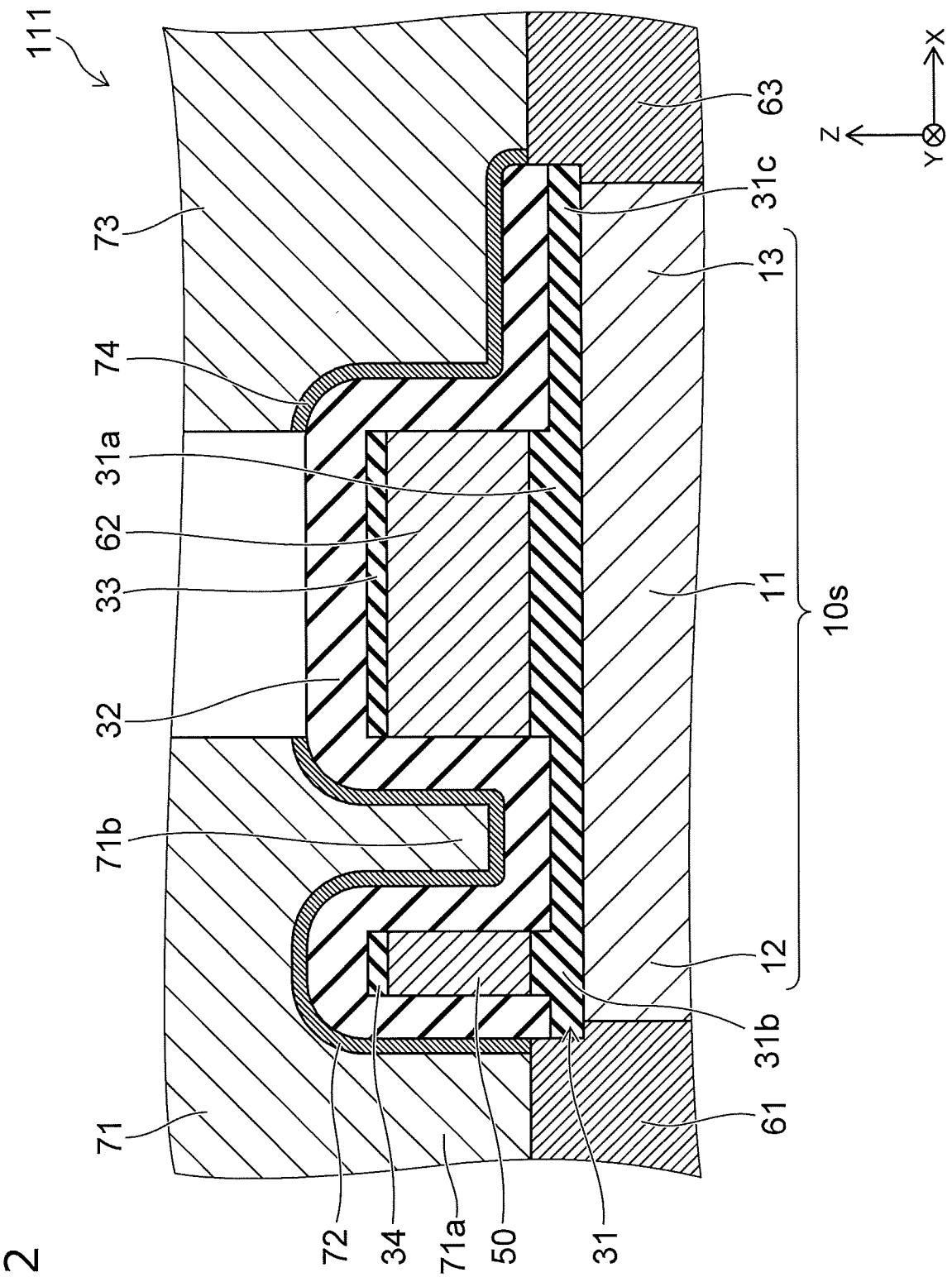
FIG. 2 is a schematic cross-sectional view illustrating a semiconductor device according to a modification of the first embodiment.

FIG. 2 is a schematic cross-sectional view illustrating a semiconductor device according to a modification of the first embodiment.

As shown in FIG. 2, the semiconductor device 111 according to the modification of the first embodiment includes the semiconductor portion 10s, the source electrode 61, the gate electrode 62, the drain electrode 63, the first structure body 50, and the first insulating portion 31. The semiconductor portion 10s includes silicon carbide (SiC). The semiconductor portion 10s includes the first to third semiconductor regions 11 to 13. The first insulating portion 31 includes the first to third insulating regions 31a to 31c.

In the example, the first semiconductor region 11 is of the second conductivity type (e.g., the p-type). The second semiconductor region 12 and the third semiconductor region 13 are of the first conductivity type (e.g., the n-type).

The direction from the second semiconductor region 12 toward the first semiconductor region 11 is aligned with the second direction (the X-axis direction). The direction from the first semiconductor region 11 toward the third semiconductor region 13 is aligned with the second direction (the X-axis direction). The first semiconductor region 11 is positioned between the second semiconductor region 12 and the third semiconductor region 13 in the second direction (the X-axis direction).

The first to third semiconductor regions 11 to 13 are positioned between the source electrode 61 and the drain electrode 63 in the second direction (the X-axis direction). The second semiconductor region 12 is positioned between the source electrode 61 and the first semiconductor region 11 in the second direction (the X-axis direction). The third semiconductor region 13 is positioned between the first semiconductor region 11 and the drain electrode 63 in the second direction (the X-axis direction).

The source electrode 61 is electrically connected to the second semiconductor region 12.

The gate electrode 62 is provided on the first semiconductor region 11. The direction from the first semiconductor region 11 toward the gate electrode 62 is aligned with the first direction (the Z-axis direction).

The drain electrode 63 is electrically connected to the third semiconductor region 13.

The first structure body 50 is provided on the second semiconductor region 12. The direction from the second semiconductor region 12 toward the first structure body 50 is aligned with the first direction (the Z-axis direction). The first structure body 50 includes at least one of polysilicon or TiN.

For example, the first insulating region 31a is provided on the first semiconductor region 11. The second insulating region 31b is provided on the second semiconductor region 12. The third insulating region 31c is provided on the third semiconductor region 13. The gate electrode 62 is provided on the first insulating region 31a. The first structure body 50 is provided on the second insulating region 31b. The source electrode 61 is provided at the side of the second semiconductor region 12. In the example, a portion of the source electrode 61 is positioned at the side of the second insulating region 31b. The drain electrode 63 is provided at the side of the third semiconductor region 13. In the example, a portion of the drain electrode 63 is positioned at the side of the third insulating region 31c.

As shown in FIG. 2, the first to fourth conductive portions 71 to 74 and the second to fourth insulating portions 32 to 34 are further provided in the example.

The first conductive portion 71 is electrically connected to the source electrode 61. The first conductive portion 71 includes the first conductive region 71a and the second conductive region 71b. The direction from the source electrode 61 toward the first conductive region 71a is aligned with the first direction (the Z-axis direction). For example, the second conductive region 71b is positioned between the first structure body 50 and the gate electrode 62 in the second direction (the X-axis direction). The first conductive portion 71 includes, for example, a metal such as Al, etc.

The second conductive portion 72 is provided between the second insulating portion 32 and the first conductive portion 71. The second conductive portion 72 includes, for example, a metal such as Ti, etc.

The third conductive portion 73 is electrically connected to the drain electrode 63. The direction from the drain electrode 63 toward the third conductive portion 73 is aligned with the first direction (the Z-axis direction). The direction from the first conductive portion 71 toward the third conductive portion 73 is aligned with the second direction (the X-axis direction). The third conductive portion 73 includes, for example, a metal such as Al, etc.

The fourth conductive portion 74 is provided between the second insulating portion 32 and the third conductive portion 73. The fourth conductive portion 74 includes, for example, a metal such as Ti, etc.

The second insulating portion 32 is provided on the gate electrode 62, on the first structure body 50, and on the first insulating portion 31. A portion of the second insulating portion 32 is provided between the gate electrode 62 and the first conductive portion 71. A portion of the second insulating portion 32 insulates the gate electrode 62 and the first conductive portion 71 from each other. Another portion of the second insulating portion 32 is provided between the first structure body 50 and the first conductive portion 71. The other portion of the second insulating portion 32 insulates the first structure body 50 and the first conductive portion 71 from each other. The second insulating portion 32 includes, for example, silicon oxide.

The first structure body 50 is positioned between the second insulating region 31b and the second insulating portion 32. For example, the second insulating portion 32 covers the first structure body 50 provided on the second insulating region 31b. The gate electrode 62 is positioned between the first insulating region 31a and the second insulating portion 32. For example, the second insulating portion 32 covers the gate electrode 62 provided on the first insulating region 31a.

In the example, one other portion of the second insulating portion 32 is positioned between the first structure body 50 and the gate electrode 62 in the second direction (the X-axis direction). The one other portion of the second insulating portion 32 is positioned between the second conductive region 71b of the first conductive portion 71 and the first insulating portion 31 in the first direction (the Z-axis direction).

The third insulating portion 33 is provided on the gate electrode 62. The direction from the gate electrode 62 toward the third insulating portion 33 is aligned with the first direction (the Z-axis direction). The gate electrode 62 is positioned between the first insulating region 31a and the third insulating portion 33 in the first direction (the Z-axis direction). The third insulating portion 33 includes, for example, silicon oxide.

The fourth insulating portion 34 is provided on the first structure body 50. The direction from the first structure body 50 toward the fourth insulating portion 34 is aligned with the first direction (the Z-axis direction). The first structure body 50 is positioned between the second insulating region 31b and the fourth insulating portion 34 in the first direction (the Z-axis direction). The fourth insulating portion 34 includes, for example, silicon oxide.

The semiconductor device 111 is, for example, a transistor. For example, the first insulating portion 31 functions as a gate insulating film. For example, the second to fourth insulating portions 32 to 34 function as inter-layer insulating films. For example, the first conductive portion 71 and the third conductive portion 73 function as interconnect electrodes. For example, the second conductive portion 72 and the fourth conductive portion 74 function as barrier metals.

For example, a region that includes the first semiconductor region 11 and the second semiconductor region 12 functions as a channel region. For example, the third semiconductor region 13 functions as a drift region. The second semiconductor region 12 functions as a contact region for the source electrode 61.

The gate electrode 62 overlaps the second semiconductor region 12 in the first direction (the Z-axis direction). For example, a portion of the first insulating region 31a of the first insulating portion 31 is positioned between the second semiconductor region 12 and the gate electrode 62 in the first direction (the Z-axis direction).

The gate electrode 62 overlaps the third semiconductor region 13 in the first direction (the Z-axis direction). For example, another portion of the first insulating region 31a of the first insulating portion 31 is positioned between the third semiconductor region 13 and the gate electrode 62 in the first direction (the Z-axis direction).

In the modification as well, the first structure body 50 that includes at least one of polysilicon or TiN is provided between the source electrode 61 and the gate electrode 62; for example, the Ni that is freed from the source electrode 61 and reaches the gate electrode 62 can be suppressed thereby. The increase of the leakage current between the source electrode 61 and the gate electrode 62 can be suppressed thereby. For example, the reliability of the device can be increased.

Second Embodiment

FIG. 3 is a schematic cross-sectional view illustrating a semiconductor device according to a second embodiment.

As shown in FIG. 3, the semiconductor device 120 according to the embodiment includes the semiconductor portion 10s, the semiconductor layer 10L, the source electrode 61, the gate electrode 62, the drain electrode 63, a first structure body 50A, and the first insulating portion 31. For example, other than the first structure body 50A, the configuration of the semiconductor device 120 is substantially the same as the configuration of the semiconductor device 110.

The first structure body 50A includes a first portion p1. The first portion p1 is positioned between the source electrode 61 and the second insulating region 31b. For example, the first portion p1 is positioned between the source electrode 61 and the second insulating region 31b in the second direction (the X-axis direction). For example, the first portion p1 contacts the second semiconductor region 12. The first portion p1 includes at least one of polysilicon or TiN.

For example, the first to third partial regions 11a to 11c are provided on the drain electrode 63. The first insulating region 31a is provided on the first partial region 11a. The gate electrode 62 is provided on the first insulating region 31a. The third semiconductor region 13 is provided on the second partial region 11b. The second semiconductor region 12 is provided on the third semiconductor region 13. The second insulating region 31b is provided on the second semiconductor region 12. The first structure body 50A is provided at the side of the second insulating region 31b. The first portion p1 of the first structure body 50A is positioned at the side of the second insulating region 31b. The source electrode 61 is provided on the third partial region 11c. In the example, a portion of the source electrode 61 is positioned at the side of the second semiconductor region 12. A portion of the source electrode 61 is positioned at the side of the second insulating region 31b.

As shown in FIG. 3, the first conductive portion 71, the second conductive portion 72, the second insulating portion 32, and the third insulating portion 33 are further provided in the example. For example, the configurations of the first conductive portion 71, the second conductive portion 72, the second insulating portion 32, and the third insulating portion 33 of the semiconductor device 120 are substantially the same as the configurations of the first conductive portion 71, the second conductive portion 72, the second insulating portion 32, and the third insulating portion 33 of the semiconductor device 110.

In the embodiment, the first structure body 50A may further include a second portion p2. The second portion p2 is positioned between the source electrode 61 and the second insulating portion 32. For example, the second portion p2 is positioned between the first conductive region 71a and the second insulating portion 32 in the second direction (the X-axis direction). For example, the first portion p1 and the second portion p2 are continuous. The second portion p2 includes at least one of polysilicon or TiN.

In the embodiment, the first structure body 50A may further include a third portion p3. The third portion p3 is provided between the second insulating region 31b and the first conductive portion 71 in the first direction (the Z-axis direction). The third portion p3 may be provided between the second insulating portion 32 and the first conductive portion 71 in the first direction (the Z-axis direction). For example, the second portion p2 and the third portion p3 are continuous. The third portion p3 may include at least one of polysilicon or TiN.

In the example, a portion of the second conductive portion 72 is provided between the second insulating portion 32 and the first conductive portion 71. Another portion of the second conductive portion 72 is provided between the first structure body 50A and the first conductive portion 71. For example, the other portion of the second conductive portion 72 is provided between the second portion p2 of the first structure body 50A and the first conductive portion 71 and between the third portion p3 of the first structure body 50A and the first conductive portion 71.

In the embodiment, the first portion p1 that includes at least one of polysilicon or TiN is provided between the source electrode 61 and the first insulating portion 31; for example, Ni that is freed from the source electrode 61 and reaches the first insulating portion 31 can be suppressed thereby. The second portion p2 that includes at least one of polysilicon or TiN is provided between the source electrode 61 and the second insulating portion 32; for example, Ni that is freed from the source electrode 61 and reaches the second insulating portion 32 can be suppressed thereby. Thereby, the Ni that reaches the gate electrode 62 can be suppressed; and the increase of the leakage current between the source electrode 61 and the gate electrode 62 can be suppressed. For example, the reliability of the device can be increased.

In the embodiment, for example, the first portion p1 and the second portion p2 of the first structure body 50 that include at least one of polysilicon or TiN absorb or block Ni. For example, in the case where the first portion p1 and the second portion p2 include polysilicon, the Ni that is freed from the source electrode 61 bonds with the polysilicon included in the first portion p1 and the second portion p2 and is adsorbed by the first portion p1 and the second portion p2 easily. For example, in the case where the first portion p1 and the second portion p2 include TiN, the Ni that is freed from the source electrode 61 does not pass through the first portion p1 and the second portion p2 easily. The Ni that is freed from the source electrode 61 and reaches the gate electrode 62 can be suppressed thereby.

In the embodiment, the structure body 50A includes at least one of the first portion p1 or the second portion p2. At least one of the first portion p1 or the second portion p2 includes at least one of polysilicon or TiN.

In the embodiment, the first structure body 50A may include the first portion p1 but not include the second portion p2. In such a case, the first portion p1 includes at least one of polysilicon or TiN. In the embodiment, the first structure body 50A may include the first portion p1 and the second portion p2; and the second portion p2 may not include polysilicon or TiN. In such a case, the first portion p1 includes at least one of polysilicon or TiN.

In the embodiment, the first structure body 50A may include the second portion p2 but not include the first portion p1. In such a case, the second portion p2 includes at least one of polysilicon or TiN. In the embodiment, the first structure body 50A may include the first portion p1 and the second portion p2; and the first portion p1 may not include polysilicon or TiN. In such a case, the second portion p2 includes at least one of polysilicon or TiN.

As shown in FIG. 3, the semiconductor device 120 may further include the fourth semiconductor region 14, the fifth semiconductor region 15, the other source electrode 61A, and a second structure body 52A. The first semiconductor region 11 may further include the fourth partial region 11d and the fifth partial region 11e. The first insulating portion 31 may further include the third insulating region 31c. For example, the configurations of the fourth semiconductor region 14, the fifth semiconductor region 15, and the other source electrode 61A of the semiconductor device 120 are substantially the same as the configurations of the fourth semiconductor region 14, the fifth semiconductor region 15, and the other source electrode 61A of the semiconductor device 110.

The second structure body 52A is provided at the side of the third insulating region 31c. The second structure body 52A includes a fourth portion p4. The fourth portion p4 is positioned between the third insulating region 31c and the other source electrode 61A. For example, the fourth portion p4 is positioned between the third insulating region 31c and the other source electrode 61A in the second direction (the X-axis direction). For example, the fourth portion p4 contacts the fourth semiconductor region 14. The fourth portion p4 includes at least one of polysilicon or TiN.

The second structure body 52A may further include a fifth portion p5. The fifth portion p5 is positioned between the second insulating portion 32 and the other source electrode 61A. For example, the fifth portion p5 is positioned between the second insulating portion 32 and the fifth conductive region 71e in the second direction (the X-axis direction). For example, the fourth portion p4 and the fifth portion p5 are continuous. The fifth portion p5 includes at least one of polysilicon or TiN.

The second structure body 52A may further include a sixth portion p6. The sixth portion p6 is provided between the third insulating region 31c and the first conductive portion 71 in the first direction (the Z-axis direction). The sixth portion p6 may be provided between the second insulating portion 32 and the first conductive portion 71 in the first direction (the Z-axis direction). For example, the fifth portion p5 and the sixth portion p6 are continuous. The sixth portion p6 may include at least one of polysilicon or TiN.

FIG. 4 is a schematic cross-sectional view illustrating a semiconductor device according to a modification of the second embodiment.

As shown in FIG. 4, the semiconductor device 121 according to the embodiment includes the semiconductor portion 10s, the source electrode 61, the gate electrode 62, the drain electrode 63, the first structure body 50A, and the first insulating portion 31. For example, other than the first structure body 50A, the configuration of the semiconductor device 121 is substantially the same as the configuration of the semiconductor device 111.

For example, the configuration of the first structure body 50A of the semiconductor device 121 is substantially the same as the configuration of the first structure body 50A of the semiconductor device 120.

For example, the first insulating region 31a is provided on the first semiconductor region 11. The second insulating region 31b is provided on the second semiconductor region 12. The third insulating region 31c is provided on the third semiconductor region 13. The gate electrode 62 is provided on the first insulating region 31a. The first structure body 50A is provided at the side of the second insulating region 31b. The first portion p1 of the first structure body 50A is positioned at the side of the second insulating region 31b. The source electrode 61 is provided at the side of the second semiconductor region 12. In the example, a portion of the source electrode 61 is positioned at the side of the first portion p1. The drain electrode 63 is provided at the side of the third semiconductor region 13. In the example, a portion of the drain electrode 63 is positioned at the side of the third insulating region 31c.

In the modification as well, the first portion p1 that includes at least one of polysilicon or TiN is provided between the source electrode 61 and the first insulating portion 31; for example, Ni that is freed from the source electrode 61 and reaches the first insulating portion 31 can be suppressed thereby. The second portion p2 that includes at least one of polysilicon or TiN is provided between the source electrode 61 and the second insulating portion 32; for example, Ni that is freed from the source electrode 61 and reaches the second insulating portion 32 can be suppressed thereby. Thereby, the Ni that reaches the gate electrode 62 can be suppressed; and the increase of the leakage current between the source electrode 61 and the gate electrode 62 can be suppressed. For example, the reliability of the device can be increased.

According to the embodiments, a semiconductor device can be provided in which the characteristics can be improved. In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor portions, insulating portions, electrodes, conductive portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor portion including SiC and including first to third semiconductor regions,
   the first semiconductor region being of a first conductivity type and including first to third partial regions,
   the second semiconductor region being of the first conductivity type, a first direction from the second partial region toward the second semiconductor region crossing a second direction from the second partial region toward the first partial region,
   the second partial region being provided between the third partial region and the first partial region in the second direction,
   the third semiconductor region being of a second conductivity type and being provided between the second partial region and the second semiconductor region in the first direction;
   a gate electrode, a direction from the first partial region toward the gate electrode being aligned with the first direction;
   a source electrode electrically connected to the second semiconductor region, a direction from the third partial region toward the source electrode being aligned with the first direction;

a first structure body, a position in the second direction of the first structure body being between a position in the second direction of the source electrode and a position in the second direction of the gate electrode;
a first insulating portion including a first insulating region and a second insulating region,
 the first insulating region being provided between the first partial region and the gate electrode in the first direction,
 the second insulating region being provided between the second semiconductor region and the first structure body in the first direction,
 a direction from the second insulating region toward the first insulating region being aligned with the second direction,
the first structure body including at least one of polysilicon or TiN; and
a first conductive portion electrically connected to the source electrode,
 the first conductive portion including a first conductive region, and a second conductive region,
 a direction from the source electrode toward the first conductive region being aligned with the first direction, and
 the second conductive region being positioned between the first structure body and the gate electrode in the second direction.

2. The device according to claim 1, further comprising a third insulating portion,
the gate electrode being positioned between the first insulating region and the third insulating portion in the first direction.

3. The device according to claim 1, further comprising a fourth insulating portion,
the first structure body being positioned between the second insulating region and the fourth insulating portion in the first direction.

4. The device according to claim 1, wherein the first structure body contacts the second insulating region.

5. The device according to claim 1, wherein
the second semiconductor region is positioned between the source electrode and the first partial region in the second direction, and
the third semiconductor region is positioned between the source electrode and the first partial region in the second direction.

6. A semiconductor device, comprising:
a semiconductor portion including SiC and including first to third semiconductor regions,
 the first semiconductor region being of a first conductive type and including first to third partial regions,
 the second semiconductor region being of the first conductivity type, a first direction from the second partial region toward the second semiconductor region crossing a second direction from the second partial region toward the first partial region,
 the second partial region being provided between the third partial region and the first partial region in the second direction,
 the third semiconductor region being of a second conductivity type and being provided between the second partial region and the second semiconductor region in the first direction,
a gate electrode, a direction from the first partial region toward the gate electrode being aligned with the first direction;
a source electrode electrically connected to the second semiconductor region, a direction from the third partial region toward the source electrode being aligned with the first direction;
a first structure body, a position in the second direction of the first structure body being between a position in the second direction of the source electrode and a position in the second direction of the gate electrode;
a first insulating portion including a first insulating region and a second insulating region,
 the first insulating region being provided between the first partial region and the gate electrode in the first direction,
 the second insulating region being provided between the second semiconductor region and the first structure body in the first direction,
 a direction from the second insulating region toward the first insulating region being aligned with the second direction,
the first structure body including at least one of poly silicon or TiN;
a first conductive portion electrically connected to the source electrode,
 the first conductive portion including a first conductive region,
 a direction from the source electrode toward the first conductive region being aligned with the first direction,
a second insulating portion,
 the second insulating portion being provided between the first structure body and the first conductive portion and between the gate electrode and the first conductive portion; and
a second conductive portion,
the second conductive portion being provided between the second insulating portion and the first conductive portion.

7. A semiconductor device, comprising:
a semiconductor portion including SiC and including first to third semiconductor regions,
 the first semiconductor region being of a first conductivity type and including first to third partial regions,
 the second semiconductor region being of the first conductivity type, a first direction from the second partial region toward the second semiconductor region crossing a second direction from the second partial region toward the first partial region,
 the second partial region being provided between the third partial region and the first partial region in the second direction,
 the third semiconductor region being of a second conductivity type and being provided between the second partial region and the second semiconductor region in the first direction;
a gate electrode, a direction from the first partial region toward the gate electrode being aligned with the first direction;
a source electrode electrically connected to the second semiconductor region, a direction from the third partial region toward the source electrode being aligned with the first direction;
a first insulating portion including a first insulating region and a second insulating region,
 the first insulating region being provided between the first partial region and the gate electrode in the first direction, a direction from the second insulating region toward the first insulating region being aligned with the second direction;
a first structure body including a first portion,
the first portion being positioned between the source electrode and the second insulating region,
the first portion including at least one polysilicon or TiN;
a first conductive portion electrically connected to the source electrode,
the first conductive portion including a first conductive region,
a direction from the source electrode toward the first conductive region being aligned with the first direction:
a second insulating portion,
the second insulating portion being provided between the gate electrode and the first conductive portion and between the first insulating portion and the first conductive, portion,
the first structure body including a second portion positioned between the source electrode and the second insulating portion,
the second portion including at least one of polysilicon or TiN; and
a second conductive portion,
the second conductive portion being provided between the second insulating portion and the first conductive portion and between the first structure body and the first conductive portion.

8. The device according to claim 7, wherein the first portion contacts the second semiconductor region.

9. The device according to claim 7, further comprising a third insulating portion,
the gate electrode being positioned between the first insulating region and the third insulating portion in the first direction.

10. The device according to claim 7, wherein
the second semiconductor region is positioned between the source electrode and the first partial region in the second direction, and
the third semiconductor region is positioned between the source electrode and the first partial region in the second direction.

* * * * *